(12) United States Patent
Tu

(10) Patent No.: US 8,937,808 B2
(45) Date of Patent: Jan. 20, 2015

(54) BATTERY COVER ASSEMBLY FOR PORTABLE ELECTRONIC DEVICE

(71) Applicant: Shenzhen Futaihong Precision Industry Co., Ltd., Shenzhen (CN)

(72) Inventor: Feng Tu, Shenzhen (CN)

(73) Assignee: ScienBiziP Consulting(Shenzhen)Co., Ltd., Guangdong (CN)

( * ) Notice: Subject to any disclaimer, the term of this patent is extended or adjusted under 35 U.S.C. 154(b) by 14 days.

(21) Appl. No.: 13/690,271

(22) Filed: Nov. 30, 2012

(65) Prior Publication Data
US 2013/0242476 A1  Sep. 19, 2013

(30) Foreign Application Priority Data

Mar. 19, 2012  (CN) .......................... 2012 1 0072059

(51) Int. Cl.
| | | |
|---|---|---|
| *H05K 5/00* | (2006.01) | |
| *H05K 7/00* | (2006.01) | |
| *G06F 1/16* | (2006.01) | |
| *H04M 1/00* | (2006.01) | |
| *H01M 2/04* | (2006.01) | |
| *H01M 2/10* | (2006.01) | |

(52) U.S. Cl.
CPC .............. *H01M 2/0404* (2013.01); *H05K 7/00* (2013.01); *H01M 2/1066* (2013.01)
USPC .............. 361/679.56; 361/679.3; 361/679.58; 455/575.1; 455/575.8

(58) Field of Classification Search
CPC ... G06F 1/1635; G06F 1/1677; G06F 1/1679; H01M 2/1022; H01M 2/1038; H01M 2/1044; H01M 2/1055; H01M 2/1066
USPC .............. 361/679.3, 679.55, 679.56, 679.57, 361/679.58, 679.59, 679.6; 455/575.1–575.9
See application file for complete search history.

(56) References Cited

U.S. PATENT DOCUMENTS

| | | | | |
|---|---|---|---|---|
| 5,621,618 | A * | 4/1997 | Komiyama | ................... 361/732 |
| 5,716,730 | A * | 2/1998 | Deguchi | .......................... 429/97 |
| 6,975,842 | B2 * | 12/2005 | Chen | .......................... 455/90.3 |
| 7,313,410 | B2 * | 12/2007 | Tsai | ........................... 455/550.1 |
| 7,441,813 | B2 * | 10/2008 | Qin et al. | ...................... 292/163 |
| 7,606,022 | B2 * | 10/2009 | Kim | .......................... 361/679.01 |
| 7,727,666 | B2 * | 6/2010 | Liu | ................................. 429/97 |
| 7,751,181 | B2 * | 7/2010 | Chen | .......................... 361/679.01 |
| 8,254,118 | B2 * | 8/2012 | Liu | .......................... 361/679.58 |
| 8,264,836 | B2 * | 9/2012 | Peng | ........................ 361/679.56 |
| 8,351,201 | B2 * | 1/2013 | Chen et al. | .............. 361/679.56 |
| 8,373,975 | B2 * | 2/2013 | Liang et al. | ............. 361/679.02 |
| 2007/0048599 | A1 * | 3/2007 | Choi | ............................... 429/97 |

\* cited by examiner

*Primary Examiner* — Anthony Haughton
(74) *Attorney, Agent, or Firm* — Novak Druce Connolly Bove + Quigg LLP

(57) ABSTRACT

A battery cover assembly for a portable electronic device includes a base body, a battery cover, a button and an ejecting mechanism. The base body defines a first receiving groove and a second receiving groove. The battery cover includes a hook. The button is slidably attached to the base body, the button defining a latching groove and including a bar portion. The hook is releasably latched in the latching groove. The ejecting mechanism includes an ejecting member. The bar portion selectively presses the ejecting member. When the button is pressed, the hook is disengaged from the latching groove, the bar portion presses the ejecting member to force the ejecting member to eject the battery cover.

9 Claims, 10 Drawing Sheets

BATTERY COVER ASSEMBLY FOR PORTABLE ELECTRONIC DEVICE

BACKGROUND

1. Technical Field

The present disclosure generally relates to battery cover assemblies, and particularly to a battery cover assembly for use in a portable electronic device.

2. Description of related art

Batteries are widely used in portable electronic devices, such as personal digital assistants, mobile phones, and so on. Conventional batteries are attachably received in the electronic device, and battery covers are designed to connect with housings of the electronic devices to package the batteries. The battery covers can be opened to replace the batteries when, for example, the batteries are damaged and/or dead (i.e. no longer rechargeable).

Although battery cover assemblies may be simple, engagement between the battery cover and the housing of the mobile phone can be too firm to be easily detached from each other.

Therefore, there is room for improvement within the art.

BRIEF DESCRIPTION OF THE DRAWINGS

Many aspects of the battery cover assembly can be better understood with reference to the following drawings. The components in the drawings are not necessarily drawn to scale, the emphasis instead being placed upon clearly illustrating the principles of the battery cover assembly. Moreover, in the drawings, like reference numerals designate corresponding parts throughout the several views.

DETAILED DESCRIPTION

Figure 1:
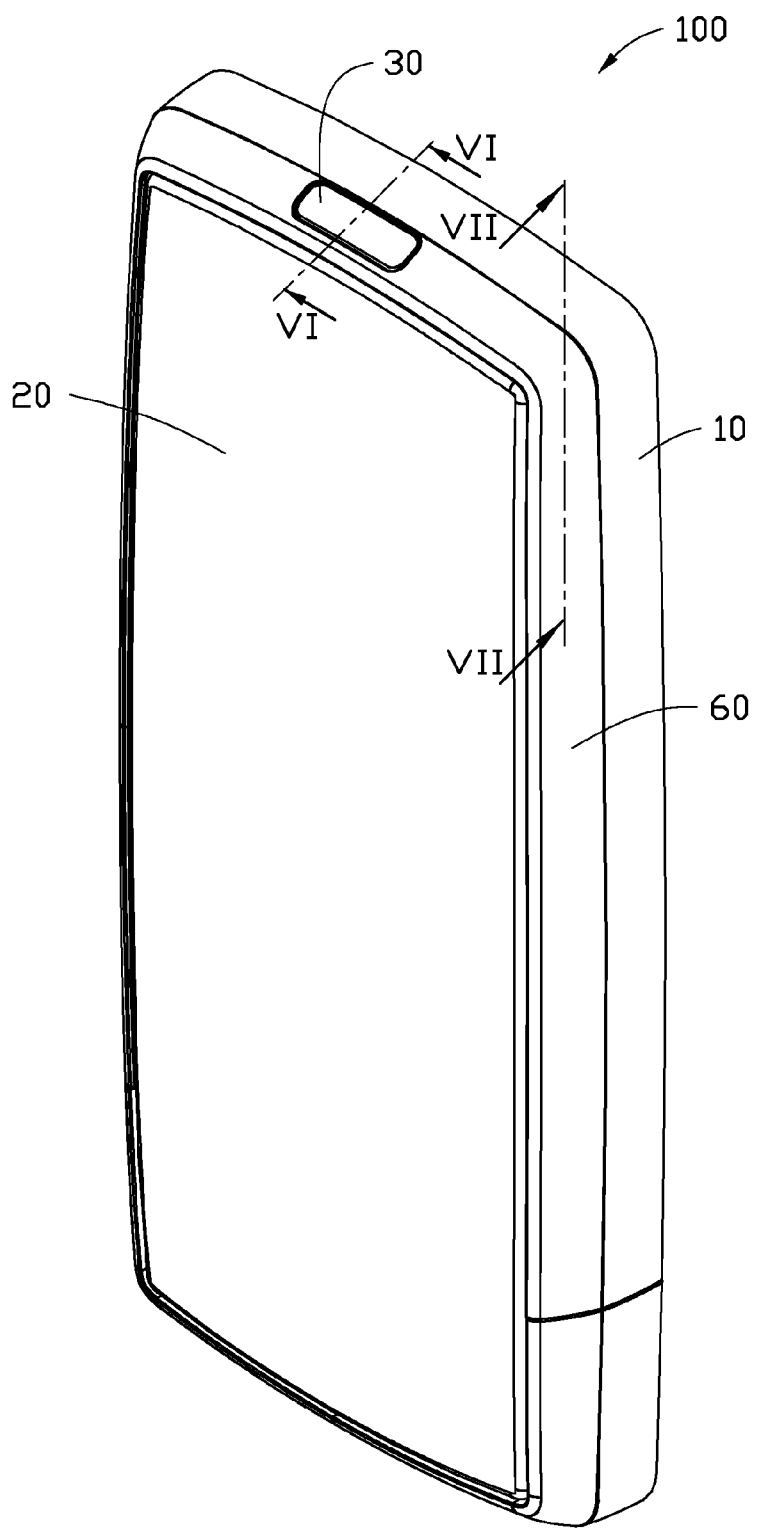
FIG. 1 is an assembled view of a portable electronic device employing a battery cover assembly in accordance with an exemplary embodiment.
Figure 2:
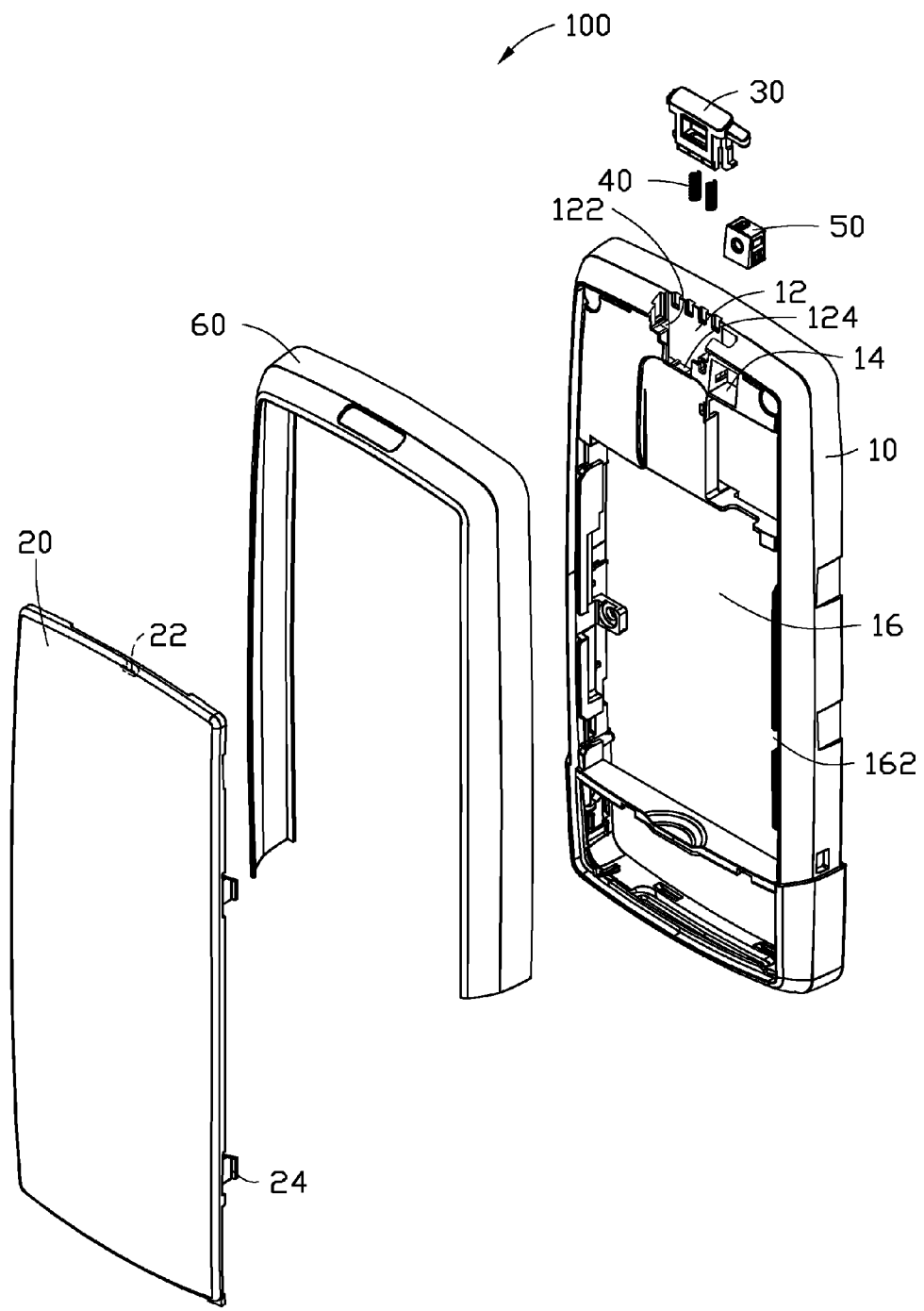
FIG. 2 is an exploded, isometric view of the battery cover assembly including a base body, a button, an ejecting mechanism, a battery cover and a subsidiary member.

FIGS. 1 and 2 show a portable electronic device 100, such as a mobile phone, employing a battery cover assembly. The mobile phone 100 is merely an exemplary application, for the purposes of describing details of an exemplary embodiment of a battery cover assembly. The battery cover assembly incorporates a base body 10, a battery cover 20, a button 30, two first elastic members 40, an ejecting mechanism 50 and a subsidiary member 60.

The base body 10 defines a first receiving groove 12 and a second receiving groove 14 communicating with the first receiving groove 12 at one end. The first receiving groove 12 is surrounded by two stepped walls 122 and a connecting wall 124. The stepped walls 122 are configured for guiding the movement of the button 30. One end of each first elastic member 40 is configured for abutting against the connecting wall 124. The base body 10 defines a battery cavity 16 and a plurality of slots 162 communicating with the battery cavity 16. The battery cover 20 has a hook 22 and a plurality of clasps 24. The hook 22 is configured for latching with the button 30. The clasps 24 are configured for latching with the slots 162.

Figure 3:
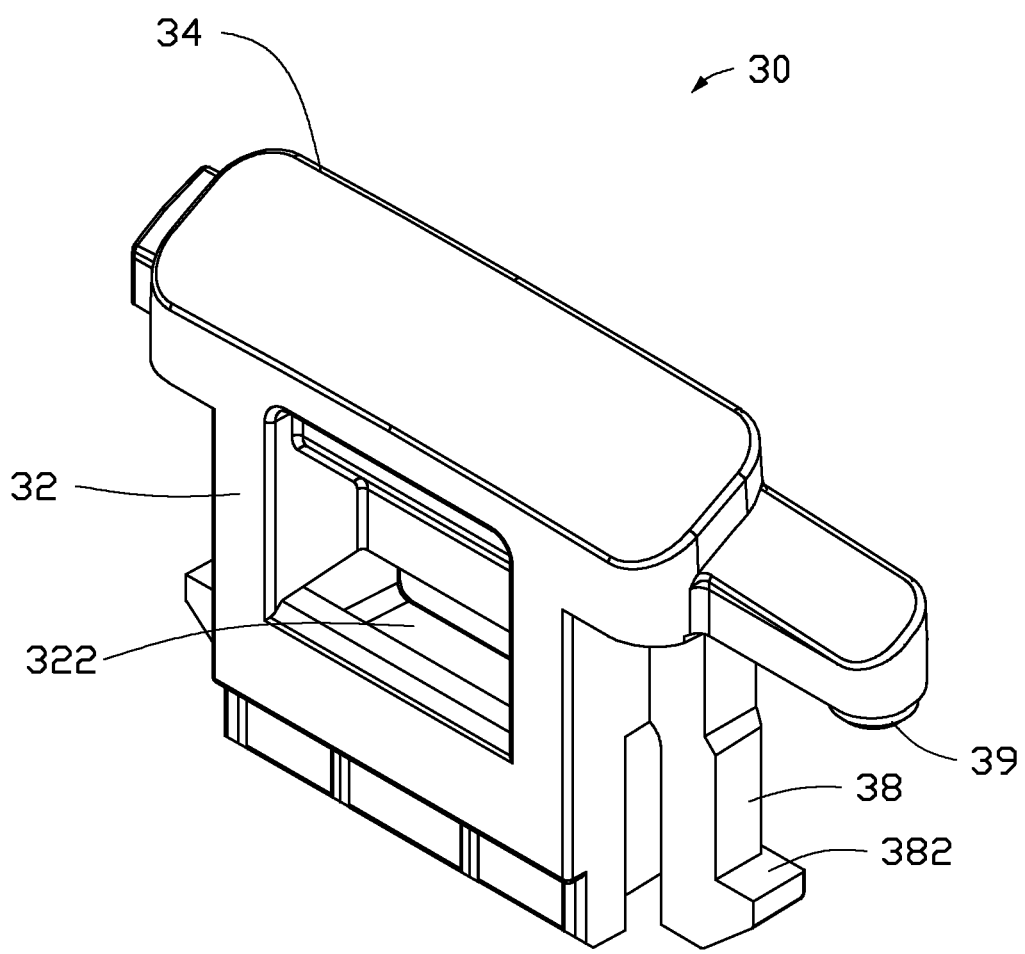
FIG. 3 is an enlarged view of the button shown in FIG. 2.
Figure 6:
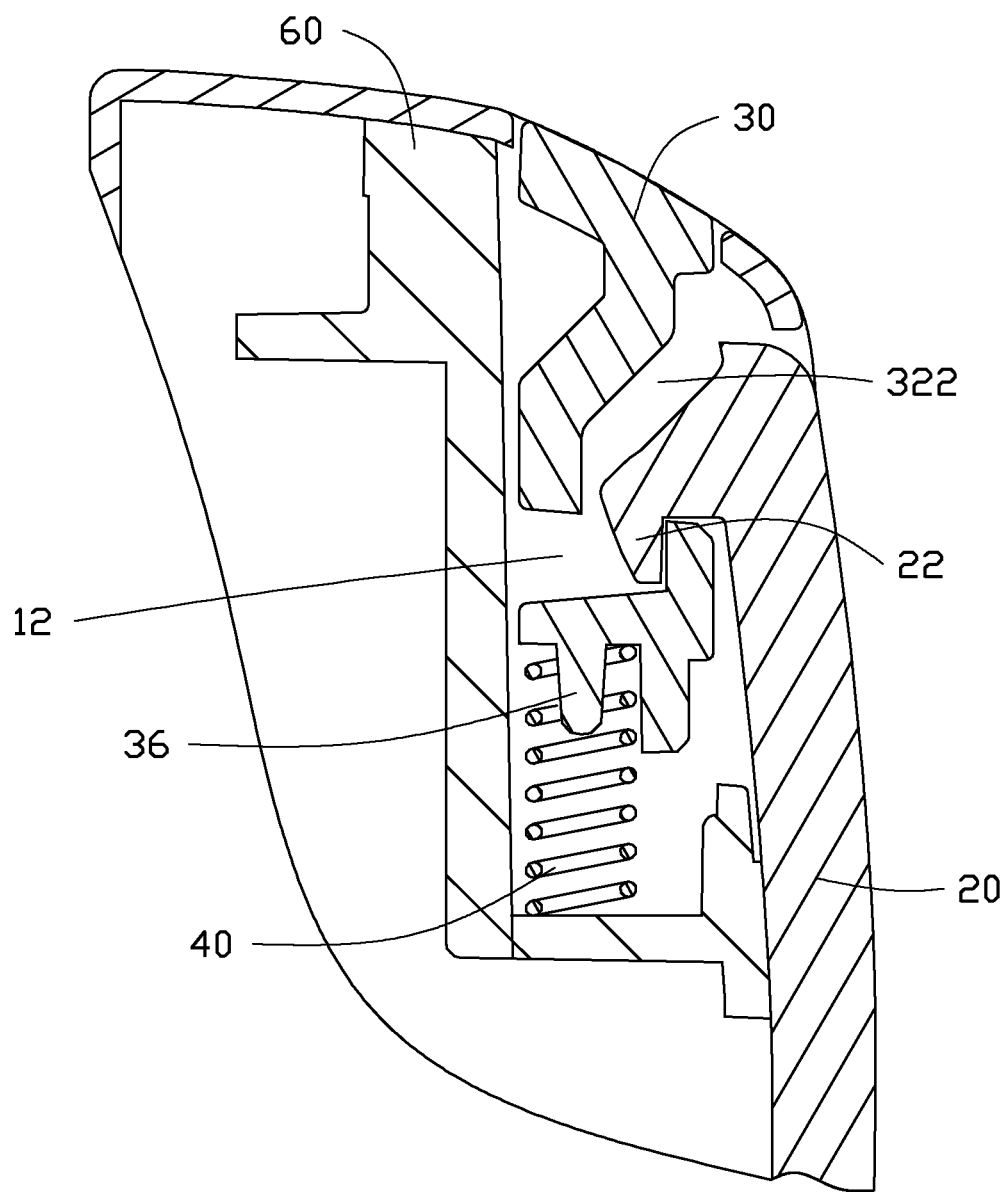
FIG. 6 is a cross sectional view of the battery cover assembly of FIG. 1 along line VI-VI.
Figure 7:
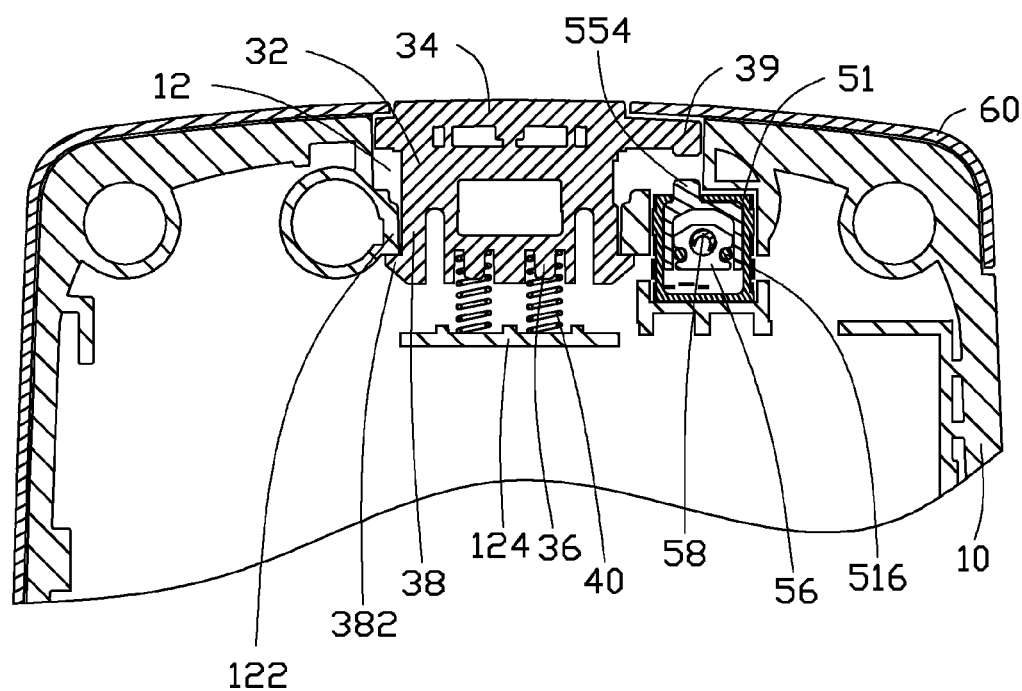
FIG. 7 is a cross sectional view of the battery cover assembly of FIG. 1 along line VII-VII in a locked state.
Figure 8:
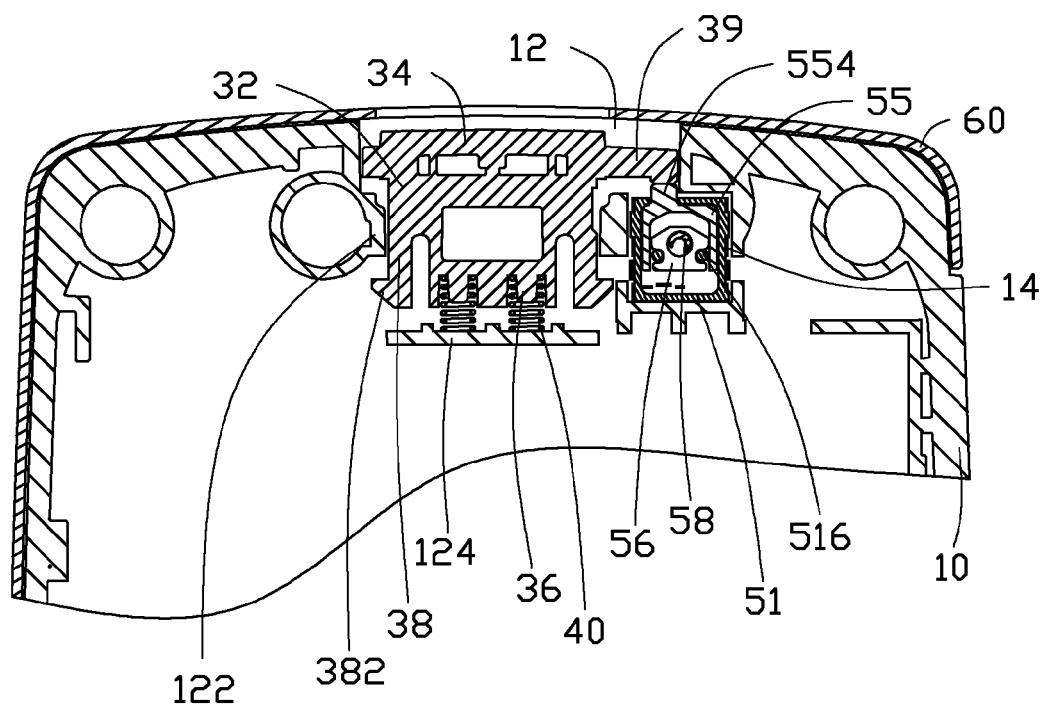
FIG. 8 is a cross sectional view of the battery cover assembly of FIG. 1 along line VII-VII in an unlocked state.
Figure 9:
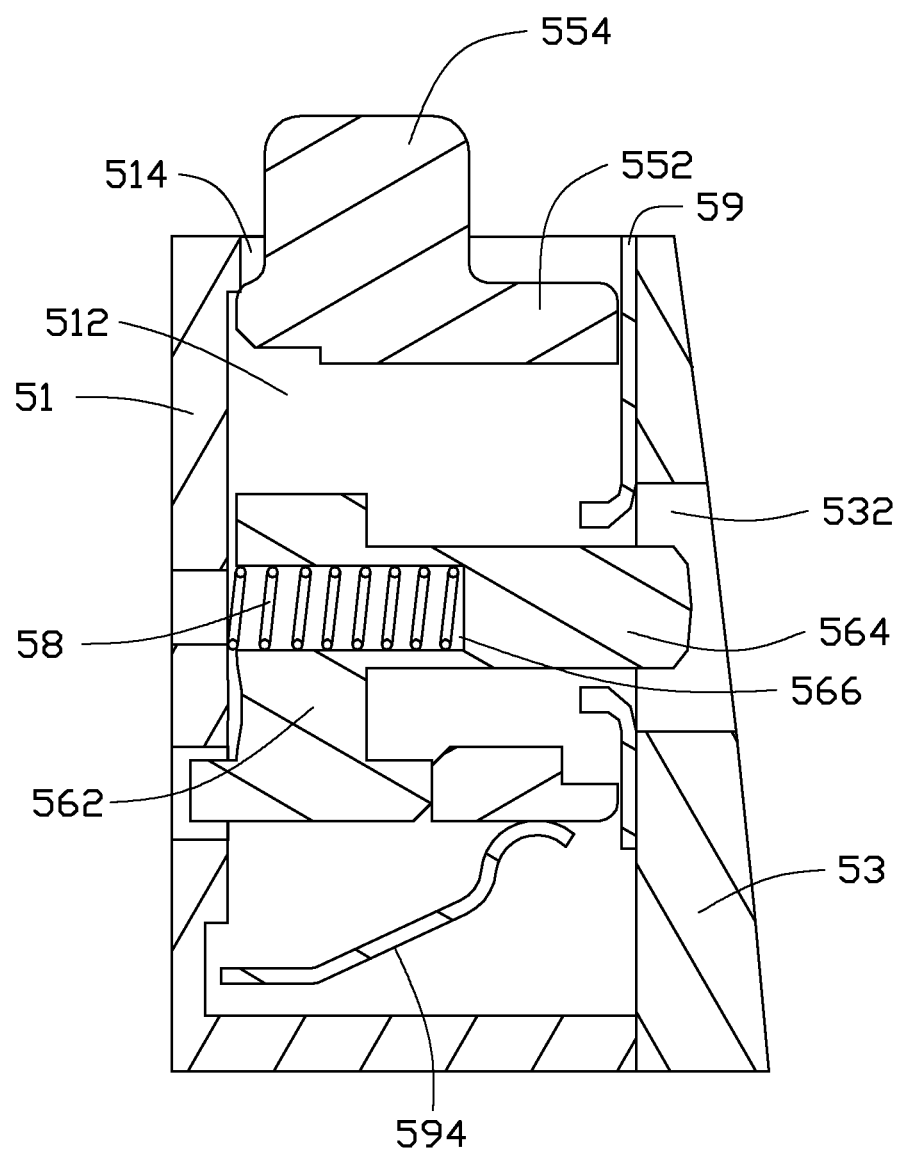
FIG. 9 is a cross sectional view of the ejecting mechanism in a first state.
Figure 10:
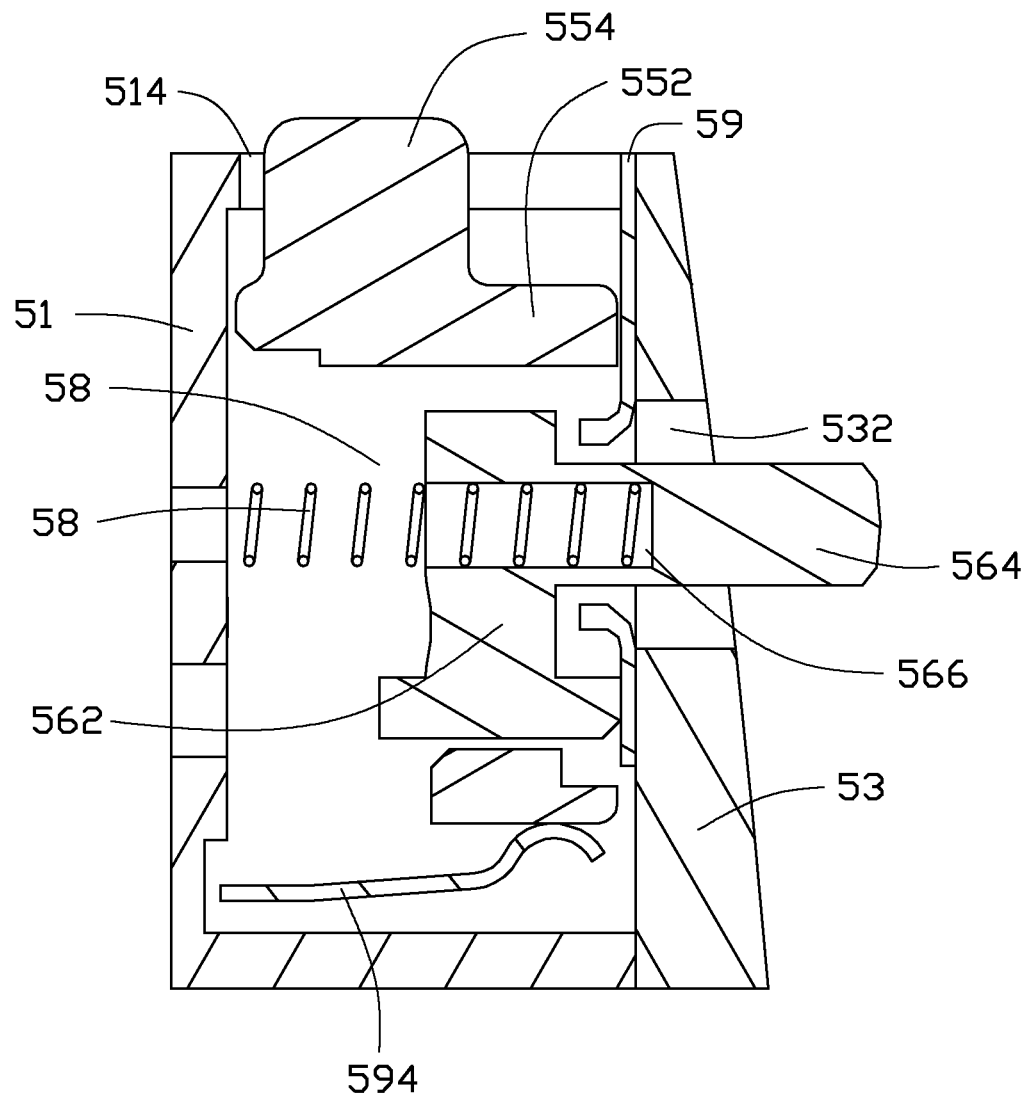
FIG. 10 is a cross sectional view of the ejecting mechanism in a second state.

Referring to FIG. 3, FIG. 6 and FIG. 7, the button 30 includes a button body 32, an operating portion 34, two posts 36, two elastic arms 38 and a bar portion 39. The button body 32 defines a latching groove 322 configured for engaging with the hook 22 of the battery cover 20. When the button 30 is pressed, the hook 22 can be released from the latching groove 322. The operating portion 34 is located at one end of the button body 32, and the two posts 36 are located at another end of the button body 32. Each first elastic member 40 is fitted around a corresponding post 36, and abuts against the connecting wall 124 for returning the button 30. Each elastic arm 38 is formed at each of the two sides of the button body 32 and includes a clamping end 382. The elastic arms 38 engage with the stepped walls 122, and the clamping ends 382 prevent the button 30 from separating from the base body 10. The bar portion 39 is located at one side of the button 30 for activating the ejecting mechanism 50.

Figure 4:
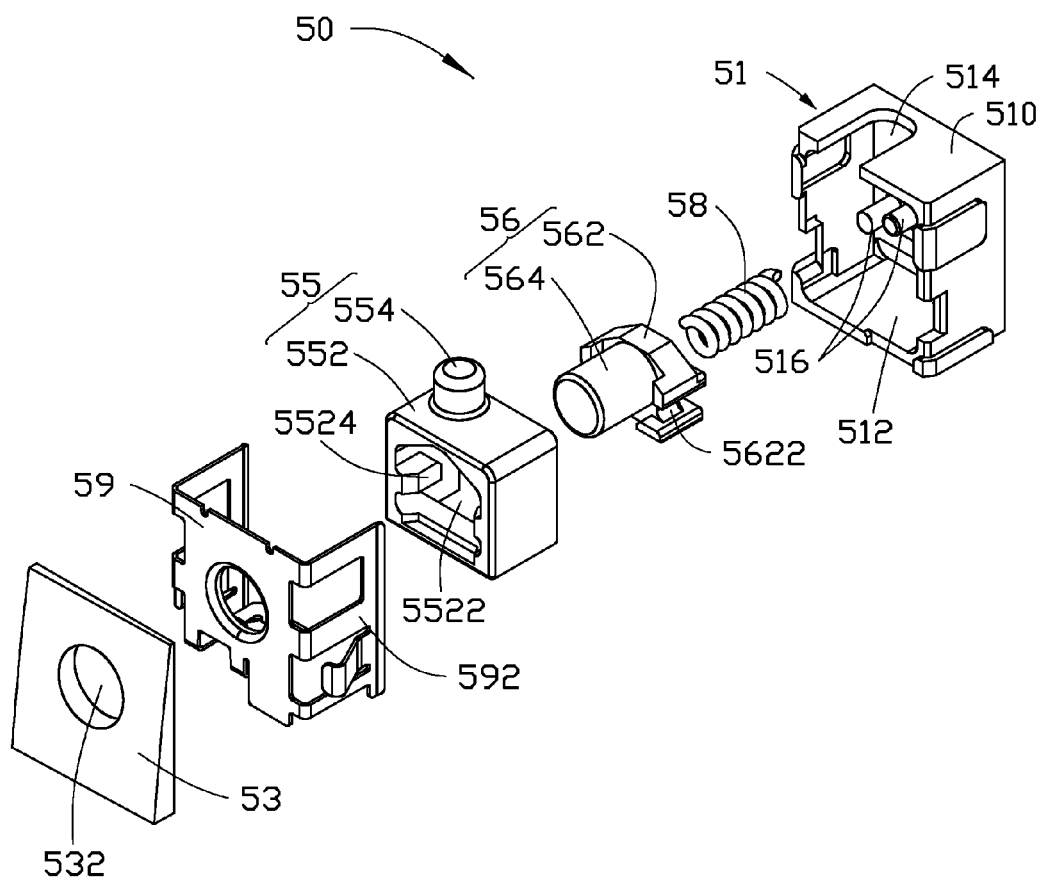
FIG. 4 is an exploded, isometric view of the ejecting mechanism shown in FIG. 2.
Figure 5:
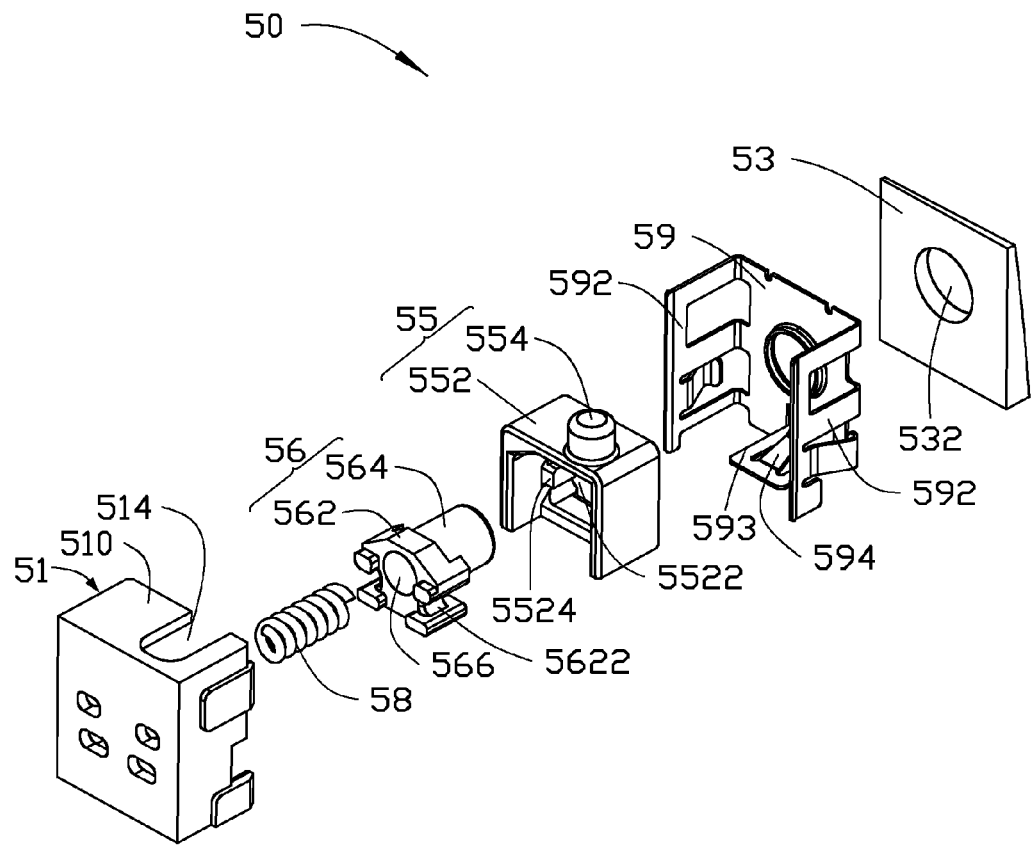
FIG. 5 is similar to FIG. 4, but shown from another aspect.

Referring to FIGS. 4 and 5, the ejecting mechanism 50 includes a case 51, a cover 53, a control member 55, an ejecting member 56, a second elastic member 58 and an elastic frame 59.

The case 51 has a peripheral wall 510 and a receiving cavity 512 surrounded by the peripheral wall 510. A cutout 514 is defined in the peripheral wall 510. A plurality of guiding pins 516 are formed in the receiving cavity 512 for guiding the ejecting member 56. The cover 53 defines a central hole 532. The control member 55 includes a box body 552 and a column 554. The box body 552 defines a chamber 5522 and two resisting blocks 5524 in the chamber 5522. The chamber 5522 allows the ejecting member 56 to extend through. The column 554 is received in the cutout 514, and is pressed by the bar portion 39. The ejecting member 56 includes a positioning portion 562 and a sleeve 564 integrally formed together. When the control member 55 and the ejecting member 56 are received in the case 51, the positioning portion 562 engages with the guiding pin 516 to allow the ejecting member 56 to slide relative to the case 51. The sleeve 564 extends through the chamber 5522, and the positioning portion 562 is configured for engaging with the guiding pins 516. The sleeve 564 defines a containing cavity 566. The second elastic member 58 is received in the containing cavity 566 of the hollow sleeve 564 for returning the ejecting member 56. The elastic frame 59 includes two opposite resisting walls 592 and a sidewall 593. A cantilever 594 is located on the sidewall 593 and is tilted relative to the sidewall 593. When the elastic frame 59 is latched on the case 51, the resisting walls 592 are latched on the peripheral wall 510, and the side all 593 is received in the receiving cavity 512. The cantilever 594 extends into the receiving cavity 512 for elastically abutting against the control member 55. The elastic frame 59 latches the control member 55 and the ejecting member 56 on the case 51. The cover 53 is mounted on the case 51 by welding or the other ways. The resisting blocks 5524 press the ejecting member 56 and makes the second elastic member 58 accumulate elastic energy. Thus, the ejecting mechanism 50 is assembled together. The sleeve 564 is exposed from the central hole 532 of the cover 53.

The subsidiary member 60 is configured for attaching to the base body 10 for latching the button 30 on the base body 10.

During assembly of the battery cover assembly, the button 30 is received in the first receiving groove 12, and the ejecting mechanism 50 is positioned in the second receiving groove 14. The column 554 faces the bar portion 39. The eject sleeve 564 faces the battery cover 20. The subsidiary member 60 is mounted on the base body 10 to prevent the button 30 from separating from the base body 10. The battery cover 20 is positioned on the base body 10, and the hook 22 faces the button 30. The battery cover 20 is pressed until the hook 22 is latched in the latching groove 322. The clasps 24 are received in the slots 162. Thus, the battery cover 20 is assembled in the base body 10.

Referring to FIGS. 7 to 10, when the battery cover 20 is to be opened, the operating portion 34 of the button 30 is pressed to allow the button 30 to slide in the first receiving groove 12 until the hook 22 is disengaged from the latching groove 322. The first elastic members 40 are compressed to accumulate elastic energy. The bar portion 39 is forced to move toward the column 554. When the bar portion 39 contacts the column 554, the bar portion 39 moves the control member 55. The resisting blocks 5524 offset the positioning portion 562, of the ejecting member 56, to unlock the ejecting member 56. The ejecting member 56 automatically bounces toward the battery cover 20 under the second elastic member 58. Thus, the battery cover 20 can then be removed.

As described above, the exemplary embodiment provides a battery cover assembly for portable electronic devices, such as mobile phones. The battery cover of the battery cover assembly can be easily opened and more user-friendly.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A battery cover assembly for a portable electronic device, the battery cover assembly comprising:
   a base body defining a first receiving groove and a second receiving groove;
   a battery cover comprising a hook;
   a button slidably received in the first receiving groove of the base body, the button defining a latching groove and including a bar portion, and the hook releasably latched in the latching groove;
   at least one first elastic member positioned in the first receiving groove for providing an elastic force to the button; and
   an ejecting mechanism received in the second receiving groove, the ejecting mechanism comprising an ejecting member, a case and a control member;
   wherein the control member and the ejecting member are attached to the case; the case has a peripheral wall and a receiving cavity surrounded by the peripheral wall, a cutout is defined in the peripheral wall, the control member comprises a column received in the cutout, and the column contacts the bar portion; a plurality of guiding pins are positioned in the receiving cavity, the ejecting member includes a positioning portion and a sleeve integrally formed together, and the positioning portion engages with the plurality of guiding pins to allow the ejecting member to slide relative to the case; the control member comprises a box body defining a chamber and two resisting blocks in the chamber, the chamber allows the ejecting member to extend through, and the resisting blocks press the ejecting member; when the button is pressed, the hook is disengaged from the latching groove, the bar portion presses the column to allow the ejecting member to eject the battery cover.

2. The battery cover assembly as claimed in claim 1, wherein the sleeve defines a containing cavity, and a second elastic member is received in the containing cavity of the sleeve for returning the ejecting member.

3. The battery cover assembly as claimed in claim 2, further comprising an elastic frame, wherein the elastic frame comprises two opposite resisting walls and a sidewall, a cantilever is located on the sidewall, is tilted relative to the sidewall, and elastically abuts the box body of the control member.

4. A portable electronic device comprising:
   a base body;
   a battery cover comprising a hook;
   a button slidably attached to the base body, the button defining a latching groove and including a bar portion, the hook releasably latched in the latching groove; and
   an ejecting mechanism attached to the base body, the ejecting mechanism comprising an ejecting member, a case and a control member;
   wherein the control member and the ejecting member are attached to the case; the case has a peripheral wall and a receiving cavity surrounded by the peripheral wall, a cutout is defined in the peripheral wall, the control member comprises a column received in the cutout, and the column contacts the bar portion; a plurality of guiding pins are positioned in the receiving cavity, the ejecting member includes a positioning portion and a sleeve integrally formed together, and the positioning portion engages with the plurality of guiding pins to allow the ejecting member to slide relative to the case; the control member comprises a box body defining a chamber and two resisting blocks in the chamber, the chamber allows the ejecting member to extend through, and the resisting blocks press the ejecting member; when the button is pressed, the hook is disengaged from the latching groove, the bar portion presses column to allow the ejecting member to eject the battery cover.

5. The portable electronic device as claimed in claim 4, further comprising an elastic frame, wherein the elastic frame comprises two opposite resisting walls and a sidewall, a cantilever is located on the sidewall, and is tilted relative to the sidewall for elastically abutting against the box body of the control member.

6. A battery cover assembly for a portable electronic device, the battery cover assembly comprising:
   a base body;
   a battery cover comprising a hook;
   a button slidably attached to the base body, the button defining a latching groove and including a bar portion, the hook releasably latched in the latching groove; and
   an ejecting mechanism attached to the base body, the ejecting mechanism comprising an ejecting member, a control member, and an elastic member; the control member comprising a box body and a column, the box body defining a chamber and two resisting blocks in the chamber; the resisting blocks configured to detachably resist against the ejecting member and make the elastic member accumulate elastic energy;
   wherein when the button is pressed, the hook is disengaged from the latching groove, the bar portion presses the column to allow the ejecting member to disengage from the resisting blocks, the elastic member drives the ejecting member to extend through the chamber to eject the battery cover.

7. The battery cover assembly of claim 6, wherein the ejecting mechanism further comprises a case having a peripheral wall and a receiving cavity surrounded by the peripheral wall, a cutout is defined in the peripheral wall, the column is received in the cutout.

8. The battery cover assembly of claim 7, wherein a plurality of guiding pins are positioned in the receiving cavity, the ejecting member includes a positioning portion and a sleeve integrally formed together, the positioning portion engages with the plurality of guiding pins to allow the ejecting member to slide relative to the case; the sleeve defines a containing cavity configured to receive the elastic member.

9. The battery cover assembly of claim 6, wherein the ejecting mechanism further comprises an elastic frame that comprises two opposite resisting walls and a sidewall, a cantilever is located on the sidewall, and is tilted relative to the sidewall; the cantilever is configured to elastically abut against the box body of the control member to return the control member.

* * * * *